(12) United States Patent
Kim et al.

(10) Patent No.: US 6,797,625 B2
(45) Date of Patent: Sep. 28, 2004

(54) METHOD OF FORMING A PROTECTIVE STEP ON THE EDGE OF A SEMICONDUCTOR WAFER

(75) Inventors: Chang Gyu Kim, Kyoungki-do (KR); Wan Shick Kim, Kyoungki-do (KR)

(73) Assignee: Dongbu Electronics Co., Ltd., Seoul (KR)

(*) Notice: Subject to any disclaimer, the term of this patent is extended or adjusted under 35 U.S.C. 154(b) by 24 days.

(21) Appl. No.: 10/306,238

(22) Filed: Nov. 27, 2002

(65) Prior Publication Data
US 2003/0114009 A1 Jun. 19, 2003

(30) Foreign Application Priority Data
Nov. 29, 2001 (KR) .................. 10-2001-0074875

(51) Int. Cl.[7] .......................... H01L 21/302
(52) U.S. Cl. ............... 438/692; 438/690; 438/691; 438/694
(58) Field of Search ................. 438/690–692, 438/694

(56) References Cited

U.S. PATENT DOCUMENTS

| | | | |
|---|---|---|---|
| 6,083,829 A | * 7/2000 | Lai et al. .................... 438/643 |
| 6,120,607 A | 9/2000 | Taravade | |
| 6,326,309 B2 | * 12/2001 | Hatanaka et al. ........... 438/693 |
| 6,417,108 B1 | * 7/2002 | Akino et al. ................ 438/690 |
| 6,440,219 B1 | 8/2002 | Nguyen | |
| 6,443,810 B1 | 9/2002 | Shih | |
| 6,482,749 B1 | * 11/2002 | Billington et al. .......... 438/745 |
| 2001/0051432 A1 | * 12/2001 | Yano et al. ................. 438/690 |
| 2002/0037628 A1 | * 3/2002 | Singh et al. ................ 438/424 |
| 2002/0106905 A1 | * 8/2002 | Tran et al. .................. 438/754 |

* cited by examiner

*Primary Examiner*—Anh Phung
*Assistant Examiner*—Christian D. Wilson
(74) *Attorney, Agent, or Firm*—Timothy J. Keefer; Seyfarth Shaw LLP

(57) ABSTRACT

A method for fabricating semiconductor devices is described, in particular a wafer chuck for holding a semiconductor wafer on which a predetermined thin layer is deposited; a processing chamber for injecting etching gas toward the wafer to form a predetermined pattern; and a clamp or a shadow ring provided on an edge of the wafer being held by the wafer chuck and preventing the edge from being etched, and thereby forming a protective step around the edge. Therefore, during a subsequent CMP process, the pattern adjacent to the edge of the wafer can be prevented from being over-polished, and reliability as well as productivity of the semiconductor devices can be improved.

6 Claims, 3 Drawing Sheets

METHOD OF FORMING A PROTECTIVE STEP ON THE EDGE OF A SEMICONDUCTOR WAFER

BACKGROUND OF THE INVENTION

1. Field of the Invention

The present invention relates to an apparatus and method for fabricating semiconductor devices, and more particularly for forming a protective step which can prevent an edge of a semiconductor wafer from being over-polished during a chemical-mechanical polishing (CMP) process.

2. Description of the Prior Art

In general, a CMP process has been applied as a planarization process for insulation layers as well as a damascene process for metallic layers.

The CMP process is employed in polishing a semiconductor wafer surface by using the friction between slurry and a pad, in which various consumables, such as slurry, a pad; a backing film, a diamond conditioner, etc., are used. The polishing property of this process is dependent upon pressure distribution between the pad and the wafer while the wafer is polished in close contact with the pad.

When the amount of polishing on one surface of a blanket wafer is uniformly maintained, pressure on the other surface of the wafer may be controlled. When the amount of polishing on an edge of the wafer is controlled, pressure on a retainer ring on the circumference of the CMP equipment may be controlled. However, there is a problem in that it is difficult to control the level of polishing resulting from a chip layout, a pattern density, a pattern height and so forth.

Before such a CMP process is performed, the wafer undergoes deposition of various thin layers, and then a predetermined pattern is formed on the wafer by photolithography and etching processes.

In the photolithography process, to inhibit photoresist contamination as well as particle generation, the photoresist applied on the wafer, in particular on the edge of the wafer, is subjected to rinsing.

The photolithography and etching processes will be specifically described below with reference to attached drawings.

Referring to FIG. 1A, to form a pattern prior to the CMP process, various thin layers are deposited on the wafer 10, and then the resulting wafer is subjected to photolithography as well as etching processes so as to form a predetermined pattern thereon.

Specifically, in the photolithography process, a predetermined insulation layer is deposited on the wafer 10, an anti-reflection layer and a photoresist layer are in turn applied on the insulation layer, an edge 12 of the wafer is rinsed, only photoresist on the edge 12 is removed, the remnant photoresist is photosensed in the presence of a mask, and a predetermined pattern 11 is formed by a reactive ion etching (RIE) process.

In general, in the RIE process, the wafer is wholly exposed to reactive gas, thereby a pattern area free from photoresist is etched together with the edge 12 of the wafer from which photoresist was rinsed and removed. Therefore, a height difference is formed in proportion to the etched amount.

In the CMP process after the thin layers are deposited on the pattern 11 which is generated by the RIE process, the edge 12 from which a part of photoresist was rinsed and removed is over-polished, which incurs damage of the wafer 10 as shown in FIG. 1B.

To avoid this problem, a dummy chip has been used, but it acts as a factor which decreases the yield of semiconductor devices. In addition, when the photoresist is not rinsed, the edge of the wafer may be free from damage. However, the wafer may not only be contaminated by the non-rinsed photoresist during transporting of the wafer. The edge thereof may be formed with particles.

SUMMARY OF THE INVENTION

Accordingly, the present invention has been made to solve the above-mentioned problems occurring in the prior art, and an object of the present invention is to provide an apparatus for fabricating semiconductor devices, in which during an etching process an edge of a semiconductor wafer is constrained from being etched by using a clamp.

Another object of the present invention is to provide an apparatus for fabricating semiconductor devices, in which during an etching process an edge of a semiconductor wafer is constrained from being etched by using a shadow ring.

Another additional object of the present invention is to provide a method for fabricating semiconductor devices, in which during a CMP process after formation of a protective step on an edge of a semiconductor wafer, over-polishing, which results in a height difference between the edge and a pattern of the wafer, is prevented.

In order to accomplish these objects, according to one embodiment of the present invention, there is provided an apparatus for fabricating semiconductor devices, comprising: a wafer chuck for holding a semiconductor wafer on which various thin layers has been deposited; a processing chamber for injecting etching gas toward the wafer to form a predetermined pattern; and a clamp, attached to an edge of the wafer being held by the wafer chuck, for preventing the edge from being etched.

According to another embodiment of the present invention, there is provided an apparatus for fabricating semiconductor devices, comprising: a wafer chuck for holding a semiconductor wafer on which various thin layers has been deposited; a processing chamber for injecting etching gas toward the wafer to form a predetermined pattern; and a shadow ring, provided in the chamber upwardly spaced apart from the wafer being held by the wafer chuck, for preventing the edge from being etched.

According to another additional embodiment of the present invention, there is provided a method for fabricating semiconductor devices using a semiconductor wafer formed with various thin layers thereon, comprising the steps of: covering the thin layers with photoresist and then partially removing the photoresist from an edge of the wafer; etching the wafer except for the edge which is free from the photoresist with etching gas, so as to form a predetermined pattern; forming a protective step on the edge at the same time as the pattern is being formed; and performing planarization of the wafer formed with the pattern and the protective step.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1A:
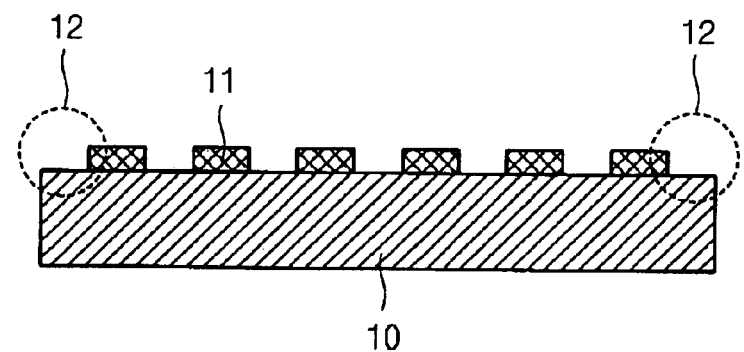
FIGS. 1A and 1B illustrate the procedures for forming a semiconductor device according to the prior art.
Figure 1B:
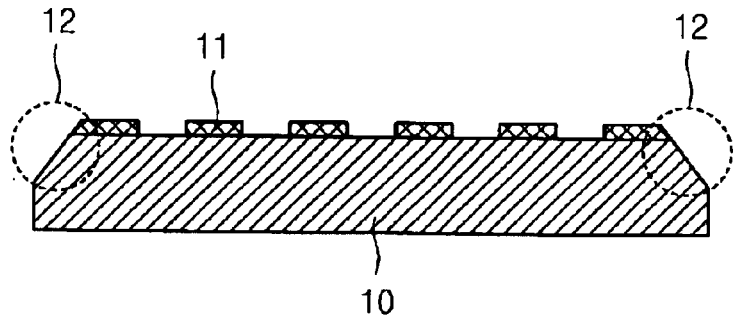

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 2:
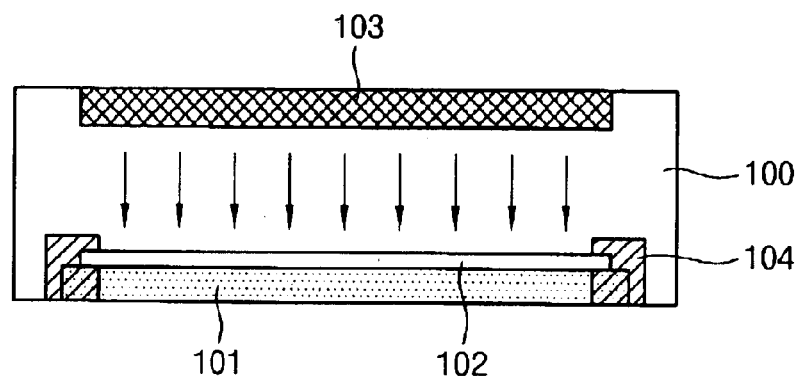
FIG. 2 is a cross-sectional view of a processing chamber for ion etching in an apparatus for fabricating a semiconductor device according to one preferred embodiment of the present invention.

Referring to FIG. 2, in an apparatus for fabricating semiconductor devices, a processing chamber 100 used in an ion etching process is housed with a wafer chuck 101 for holding a wafer 102, a gas injection head 103 for injecting gas toward the wafer 102, and a clamp 104 for grasping the wafer 102 and preventing an edge of the wafer from being etched.

The wafer 102 is subjected to deposition of various thin layers thereon, and then patterned in a predetermined pattern by a photolithography process and an etching process.

In the photolithography process, to restrict photoresist contamination and particle generation, the edge of the wafer 102 is rinsed, and only then is the photoresist on the edge removed.

The edge of the wafer 102 is grasped by the clamp 104, so that it is not etched during the etching process. As a result, the edge of the wafer is formed with a protective step.

In the CMP process following the etching process, a surface of the wafer 102 is worked by slurry supplied from the exterior as well as friction applied from a pad, so that the wafer 102 has a different level of polishing resulting from a layout of the device, a pattern density, a pattern thickness and so forth.

According to previous process in the art, during the CMP process after depositing various thin layers and forming the pattern, the edge of the wafer may be formed at a different height than the rest of the wafer. However, according to the process of the present invention, this different height can be prevented by provision of the protective step on the edge.

Therefore, the protective step around the edge of the wafer makes it possible to obtain planarization of the insulation layer deposited on the pattern of the wafer 102 for the CMP process and to prevent the edge of the wafer from being over-polished, and thus reliability and productivity of the semiconductor device can be increased.

Figure 3:
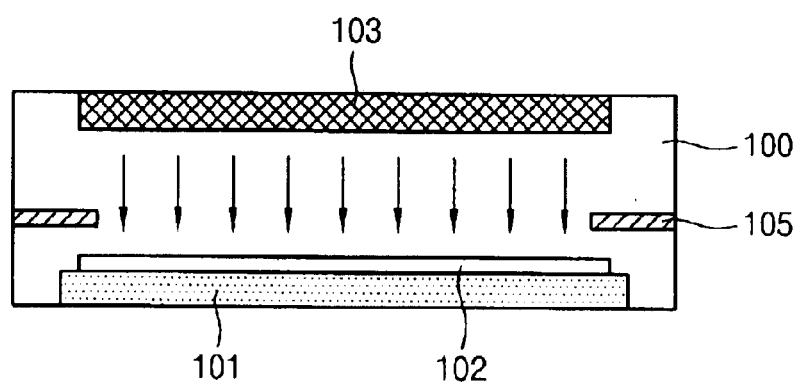
FIG. 3 is a cross-sectional view of a processing chamber for ion etching in an apparatus for fabricating a semiconductor device according to another preferred embodiment of the present invention.

Referring to FIG. 3, a processing chamber 100 according to another embodiment of the present invention is housed with a wafer chuck 101 for holding a wafer 102, a gas injection head 103 for injecting gas toward the wafer 102, and a shadow ring 105 for preventing an edge of the wafer 102 from being etched.

The wafer 102 is subjected to deposition of various thin layers thereon, and then patterned in a predetermined pattern by a photolithography process and an etching process.

In the photolithography process, to restrict photoresist contamination and particle generation, the edge of the wafer 102 is rinsed, and only then is the photoresist on the edge removed.

The edge of the wafer 102 is prevented from being etched during the etching process by the shadow ring 105, so that it is formed with a protective step.

In the CMP process following the etching process, a surface of the wafer 102 is worked in cooperation with slurry supplied from the exterior as well as friction applied from a pad, so that the wafer 102 has a different level of polishing resulting from a layout of the device, a pattern density, a pattern thickness and so forth.

According to previous process in the art, during the CMP process after depositing various thin layers and forming the pattern, the edge of the wafer may be formed at a different height than the rest of the wafer. However, according to the process of the present invention, this different height can be prevented by provision of the protective step on the edge.

Therefore, the protective step around the edge of the wafer makes it possible to obtain planarization of the insulation layer deposited on the pattern of the wafer 102 for the CMP process and to prevent the edge of the wafer from being over-polished, and thus reliability and productivity of the semiconductor device can be increased.

The procedures for processing the semiconductor device using the processing chamber as above-mentioned will be described with reference to FIGS. 4A and 4B.

Figure 4A:
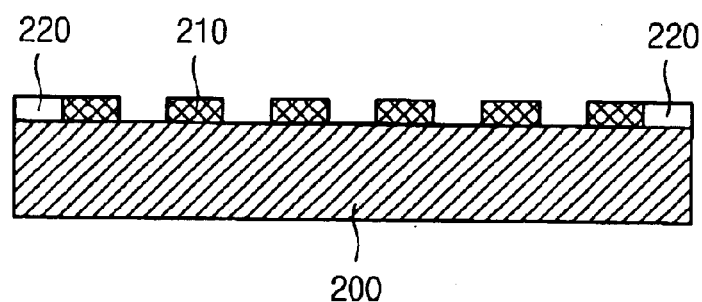
FIGS. 4A and 4B illustrate the procedures for forming a semiconductor device according to the present invention.
Figure 4B:
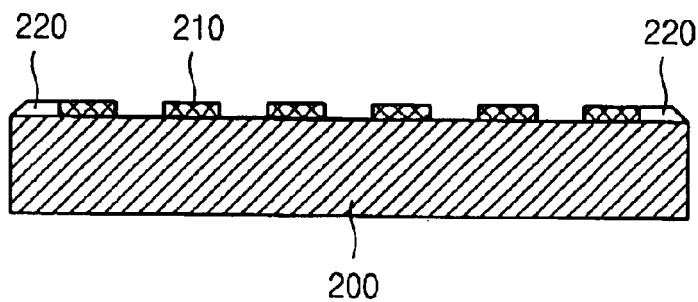

Referring to FIG. 4A, various thin layers is deposited on a wafer 200, and then a predetermined pattern 210 is formed with the resulting wafer by using a photolithography process and an etching process. The layer deposited on the wafer 200 is an insulation layer such as an oxide layer or a silicon nitride layer, or a conductive layer such as a titan layer, a titanium nitride layer, a tungsten layer, an aluminum layer or a copper layer.

In the photolithography for patterning the wafer, the top surface of the wafer with the deposited layer is covered with photoresist so as to form the pattern 210. Only the photoresist applied on an edge of the wafer is removed through rinsing so as to prevent the remnant photoresist contamination and particle generation. Here, the rinsed edge has a width of less than 3 millimeters.

The edge free from the photoresist is not exposed to etching gas due to a clamp 104 provided in the processing chamber. Therefore, the edge protected from the etching gas by means of the clamp 104 is provided with a protective step 220 after completion of the etching process.

This protective step 220 gets rid of the height difference between the pattern 210 and the edge resulting from the CMP process which follows the etching process, so that it can prevent the pattern 210 and the edge from being over-polished.

Up to now, one preferred embodiment of the present invention has been described, for example, with respect to formation of the protective step using the clamp 104. Similarly, the shadow ring 105 is installed in the processing chamber 100 upwardly spaced apart from the wafer chuck 101, so that the edge of the wafer is protected from etching conditions during the etching process, thus forming the protective step 220. With respect to formation of the protective step 220, this configuration can also obtain the same effects as the previous configuration.

FIG. 4 shows the wafer 200, which is formed with the protective step 220 and the pattern 210 by the CMP process. This protective step 220 allows the pattern 210 and the edge to avoid being over-polished resulting from the height difference between the pattern 210 and the edge during the CMP process.

As seen from the above, in the pattern formation process prior to the planarization process for fabricating semiconductor devices, to restrain the edge of the wafer from being etched during the etching process, the edge is provided with the protective step through employment of the clamp or the shadow ring. Therefore, during the CMP process following the pattern formation process, the edge can be prevented from being over-polished, and thus reliability as well as productivity of the semiconductor devices can be increased.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating semiconductor devices using a semiconductor wafer formed with various thin layers thereon, comprising the steps of:

covering the thin layers with photoresist and then partially removing the photoresist from an edge of the wafer;

etching the wafer except for the edge which is free from the photoresist with etching gas so as to form a predetermined pattern;

forming a protective step on the edge at the same time as the pattern is being formed; and performing planarization of the wafer formed with the pattern and the protective step.

2. A method as claimed in claim 1, wherein the thin layer is an insulation layer.

3. A method as claimed in claim 2, wherein the insulation layer is an oxide layer or a silicon nitride layer.

4. A method as claimed in claim 1, wherein the thin layer is a conductive layer.

5. A method as claimed in claim 4, wherein the conductive layer consists of any one selected from Ti, TiN, W, Al and Cu.

6. A method as claimed in claim 1, wherein the photoresist is removed from the edge by a width of 3 millimeters or less.

* * * * *